(12) United States Patent
Zhong et al.

(10) Patent No.: US 8,455,323 B2
(45) Date of Patent: Jun. 4, 2013

(54) METHOD FOR MANUFACTURING SEMICONDUCTOR WAFER

(75) Inventors: Huicai Zhong, Beijing (CN); Qingqing Liang, Beijing (CN); Chao Zhao, Kessel-lo (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/201,125

(22) PCT Filed: Feb. 25, 2011

(86) PCT No.: PCT/CN2011/071303
§ 371 (c)(1),
(2), (4) Date: Aug. 11, 2011

(87) PCT Pub. No.: WO2012/075735
PCT Pub. Date: Jun. 14, 2012

(65) Prior Publication Data
US 2012/0149181 A1    Jun. 14, 2012

(30) Foreign Application Priority Data
Dec. 8, 2010    (CN) .......................... 2010 1 0591794

(51) Int. Cl.
*H01L 21/336* (2006.01)
(52) U.S. Cl.
USPC .......................... 438/293; 438/294; 438/537
(58) Field of Classification Search
CPC .............................. H01L 21/24; H01L 21/182
USPC .. 438/196, 248, 293, 294, 537; 257/E21.154
See application file for complete search history.

(56) References Cited

U.S. PATENT DOCUMENTS

| 5,627,081 | A | 5/1997 | Tsuo et al. | |
|---|---|---|---|---|
| 6,380,057 | B1* | 4/2002 | Buynoski et al. | 438/592 |
| 2003/0207044 | A1 | 11/2003 | Sopori | |
| 2004/0169213 | A1* | 9/2004 | Farrar | 257/295 |
| 2008/0203572 | A1* | 8/2008 | Kurokawa et al. | 257/751 |

FOREIGN PATENT DOCUMENTS

| CN | 101238588 A | 8/2008 |
|---|---|---|
| CN | 101786628 A | 7/2010 |

OTHER PUBLICATIONS

International Search Report and Written Opinion of the Chinese State Office of Intellectual Property in foreign counterpart Application No. PCT/CN2011/071303, dated Aug. 18, 2011.
T. Buonassisi, Transition metal co-precipitation mechanisms in silicon; Mar. 14, 2007; Acta Materialia 55 (2007); ScienceDirect, (Mar. 14, 2007).

* cited by examiner

*Primary Examiner* — Khiem D Nguyen
(74) *Attorney, Agent, or Firm* — Kinney & Lange, P.A.

(57) ABSTRACT

There is provided a method for manufacturing a semiconductor wafer, comprising: performing heating so that metals dissolve into semiconductors of the wafer to form a semiconductor-metal compound; and performing cooling so that the formed semiconductor-metal compound retrogradely melt to form a mixture of the metals and the semiconductors. According to embodiments of the present invention, it is possible to achieve wafers of a high purity applicable to the semiconductor manufacture.

14 Claims, 10 Drawing Sheets

(b)

METHOD FOR MANUFACTURING SEMICONDUCTOR WAFER

CROSS-REFERENCE TO RELATED APPLICATION(S)

This application is a National Phase application of, and claims priority to, PCT Application No. PCT/CN2011/071303, filed on Feb. 25, 2011, entitled "Method for Manufacturing Semiconductor Wafer", which claimed priority to Chinese Application No. 201010591794.5, filed on Dec. 8, 2010. Both the PCT Application and the Chinese Application are incorporated herein by reference in their entireties.

FIELD OF INVENTION

The present invention relates to the field of semiconductor manufacturing, and more particularly, to a method for manufacturing a semiconductor wafer.

BACKGROUND

In semiconductor manufacturing process, semiconductor wafers, which serve as fundamental materials, will be contaminated by various factors such as metal impurities. Those contaminants will cause defects in chips made from the wafers, such that the chips may fail electrical tests. As a result, the yield of chips is reduced and thus the cost of manufacturing chips is increased.

Metals tend to generate positive ions due to their active chemical property. Such positive ions may cause various problems such as increase in the leakage current, reduction of the life time of minority carriers, and the like. Furthermore, the metal ions may move across a device for a long time after electrical tests and transportation of the device, which may cause failure of devices.

From this point of view, there is a need for a novel method for manufacturing a semiconductor wafer, by which it is possible to purify the semiconductor wafer, and especially to remove the metal impurities therein.

SUMMARY OF THE INVENTION

An object of the present invention is to provide a method for manufacturing a semiconductor wafer, by which it is possible to remove or remove at least partially impurities in the wafer, especially metal impurities in the wafer.

According to an aspect of the invention, there is provided a method for manufacturing a semiconductor wafer, comprising: performing heating so that metals dissolve into semiconductors of the wafer to form a semiconductor-metal compound; and performing cooling so that the formed semiconductor-metal compound retrogradely melt to form a mixture of the metals and the semiconductors.

With this configuration, the semiconductor-metal compound retrogradely melts so that liquid droplets are generated, and various metal elements (impurities) included in the wafer are absorbed into the liquid portion by means of the solid-liquid segregation for example. As a result, it is possible to manufacture wafers of a high purity.

Preferably, the semiconductor material may comprise silicon, and the metals may comprise copper, nickel and iron elements. Therefore, the present invention can be easily applied to the conventional semiconductor processes. Further, the heating may be performed to a temperature above 1000° C. and lower than the melting portion of Si, and the cooling may be performed to a temperature below 900° C.

The metals may be provided in various ways. For example, the metals may be provided by a metal layer formed on the wafer. Alternatively, the metals may be provided by a metal layer filled into a trench which is formed in the wafer, or the metals may provide by a metal layer filled into a trench which is formed in a hard mask formed on the wafer. The location of the trench may correspond to that of a Shallow Trench Isolation to be formed in the wafer. Alternatively, the metals may be provided to the wafer by ion implantation. The location of the implantation may correspond to that of a Shallow Trench Isolation to be formed in the wafer.

Preferably, after the cooling, the method may further comprise: removing the mixture of the metals and the semiconductors and a portion of the wafer close to the surface of the wafer. Thus, the wafer of a high purity is left.

Preferably, a portion of the wafer from a balance line to the surface of the wafer is removed, wherein the concentration of the metal elements above the balance line is greater than that in the wafer body.

Preferably, the metals dissolve into the semiconductors of the wafer to be oversaturated.

The present invention is applicable to various wafers such as Silicon on Insulator wafer, bulk silicon wafer, GaN wafer and GaAs wafer.

According to embodiments of the present invention, the impurities, especially the metal impurities such as Cu, Ni and Fe, in the wafer can be absorbed out by means of the retrograde melting of the semiconductor (for example, Si)—metal (for example, Cu, Ni and Fe, or the like) compound, so that the wafer of a high purity is fabricated. The method according to the present invention is simple to be implemented, and is easy to be incorporated into the semiconductor manufacture processes. Further, it is possible to improve the yield of chips and thus reduce the manufacture cost by manufacturing wafers according to the present invention.

BRIEF DESCRIPTION OF THE DRAWINGS

The above and other objects, features and advantages of the present invention will be more apparent from the following descriptions of embodiments of the present invention with reference to the drawings, wherein.

Figure 1:
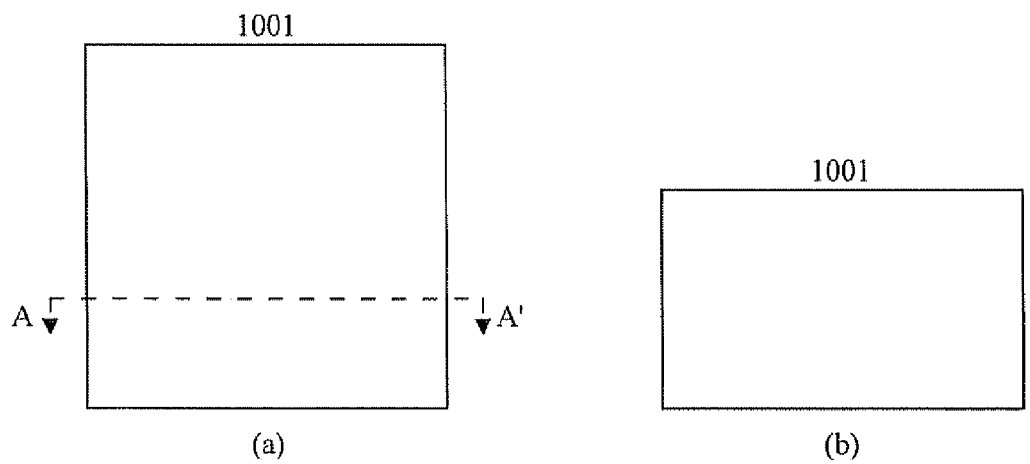
FIGS. 1-5 are schematic diagrams showing structures obtained in various steps in a processing flow of manufacturing a wafer according to a first embodiment of the present invention respectively, wherein in each of the diagrams, Fig. (*a*) is a top down view, and Fig. (*b*) is a cross section view taken along line A-A' in Fig. (*a*)

(a) is a top down view, and Fig. (b) is a cross section view taken along line A-A' in Fig. (a).

DESCRIPTION OF EMBODIMENTS

Hereinafter, the present invention is described with reference to embodiments shown in the attached drawings. However, it should be noted that those descriptions are just provided for illustrative purpose, rather than limiting the present invention. Further, in the following, descriptions of known structures and techniques are omitted so as not to obscure the concept of the present invention.

In the drawings, various layer structures according to embodiments of the present invention are schematically shown. However, they are not drawn to scale, and some features may be enlarged while some features may be omitted for clarity. Shapes, sizes and relative locations of respective regions and layers shown in the drawings are just illustrative, and deviations therefrom may occur due to manufacture tolerances and technical limits. Those skilled in the art can also devise regions/layers of different shapes, sizes and relative locations as desired.

The present invention is based on the following observation. Some semiconductor-metal compounds would have the so-called "retrograde melting" property, that is, transition from the solid phase to the liquid phase when being cooled from melted state. Examples of such semiconductor include silicon (Si) and/or germanium (Ge), and examples of such metal include copper (Cu), nickel (Ni) and/or iron (Fe). For example, a compound obtained by introducing at least one of Cu, Ni and Fe materials into Si (where Si has a melting point of about 1414° C.) will exhibit the "retrograde melting" property when being cooled (below about 900° C., for example), so that liquid droplets occur therein. When the liquid droplets occur due to retrograde melting, other metal impurities dissolved in Si tend to move into the liquid portion (which is called solid-liquid segregation). In other words, the liquid droplets generated within Si serve as a "vacuum cleaner" which absorbs the impurities.

Hereinafter, methods for manufacturing a semiconductor wafer according to various embodiments of the present invention will be described with reference to the drawings. In the following embodiments, the semiconductor material is exemplified by Si which is most commonly used in the semiconductor processes. Further, the metal material comprises at least one of Cu, Ni and Fe materials. However, it is to be noted that the present invention is not limited thereto. For example, the semiconductor material may comprise Ge, GaN, GaAs, or the like. And it is not necessary for the metal material to include all of Cu, Ni and Fe, which may comprise only some of them, or may comprise other metal materials, for example, transition metal elements such as Mn and Zn which can exhibit, together with the semiconductor material, retrograde melting property.

First Embodiment

FIGS. 1-5 are schematic diagrams showing structures obtained in various steps in a flow of manufacturing a wafer according to a first embodiment of the present invention, respectively, wherein in each of the diagrams, portion (a) is a top view, and portion (b) is a section view taken along line A-A' in portion (a).

As shown in FIG. 1, in the first embodiment, the processes in the method are performed on a prepared wafer 1001. That is, the wafer has been subjected to various processes such as Shallow Trench Isolation (STI) formation, and thus it is possible to make various semiconductor devices thereon. The wafer 1001 may comprise various types such as Semiconductor on Insulator (SOI) wafer, bulk silicon wafer, GaN wafer, GaAs wafer, or the like.

Figure 2:
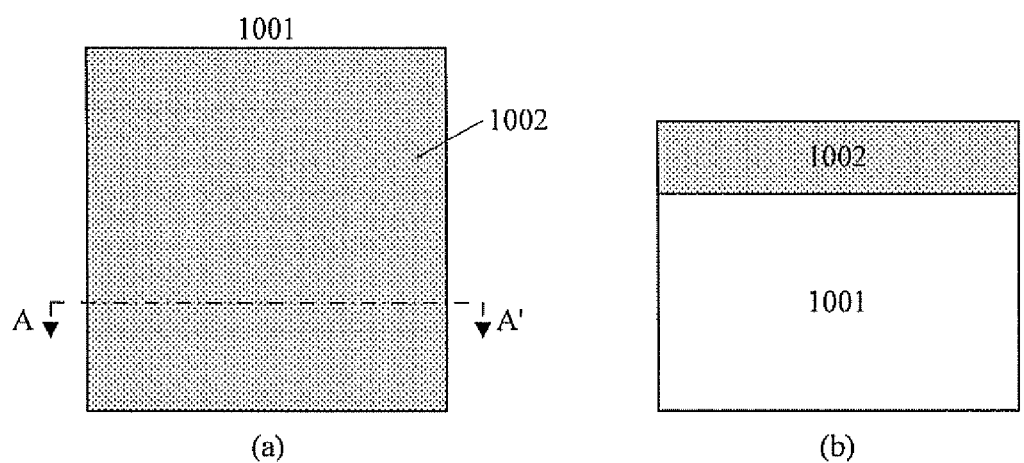

Next, as shown in FIG. 2, a metal layer 1002 is formed on a surface of the wafer 1001. The metal layer 1002 may comprise at least one of Cu, Ni and Fe elements For example, the metal layer 1002 may comprise a mixture of at least one of Cu, Ni and Fe elements formed by multi-target sputtering, or a metal stack formed by sputtering multiple layers of metals sequentially.

Figure 3:
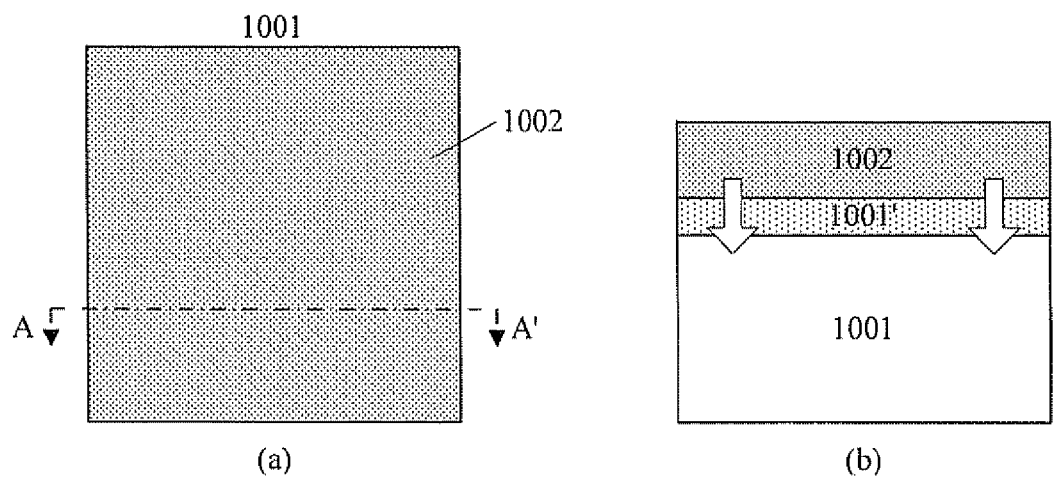

Then, the structure shown in FIG. 2 is heated to a sufficiently high temperature (above 1000° C., for example) so that the metal material (Cu, Ni and Fe) of the metal layer 1002 may dissolve into the semiconductor material (Si) of the underlying wafer 1001. Here, the heating temperature should be lower than the melting point of Si (about 1414° C.) so that Si may not melt. This procedure is shown in FIG. 3, where the dissolving of the metal elements into the wafer 1001 is indicated by the arrows shown in the figure. Therefore, in a portion 1001' of the wafer 1001 close to the surface, a compound of Si and at least one of Cu, Ni and Fe elements is formed.

Here, preferably, the dissolving of the metal material from the metal layer 1002 into the wafer 1001 becomes oversaturated due to the big amount of the metal. That is, the amount of the metal material dissolved into Si is more than that under stable conditions.

Figure 4:
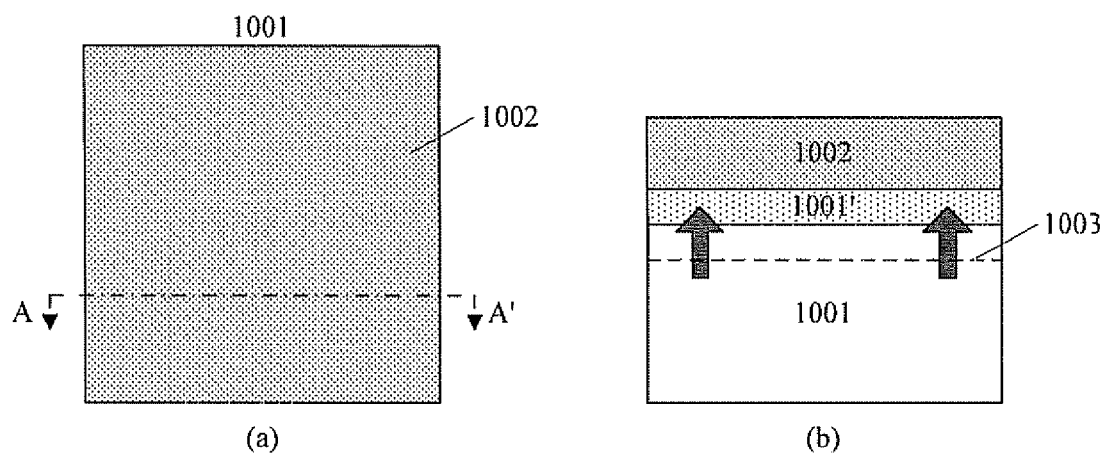

Subsequently, as shown in FIG. 4, the whole structure is cooled down gradually, for example, below 900° C., so that retrograde melting occurs. Specifically, when the structure is cooled down below 900° C., liquid droplets may be generated in the wafer 1001 due to the retrograde melting of the compound containing Si, Cu, Ni and Fe, so that the portion 1001' may transform from a solid state to a slurry-like mix of solid and liquid. As shown by arrows in FIG. 4(b), impurities (metal elements) in the underlying portion of the wafer are absorbed into the liquid portion, and thus the wafer is purified.

Of course, although most of the impurities are absorbed, a certain amount of impurities may still be distributed therein. The dashed line 1003 in FIG. 4(b) shows a "balance line" above which the concentration of the metal elements is greater than that in the wafer body. The balance line may be measured on site, or may be obtained statistically by a plurality of tests made in advance.

Figure 5:
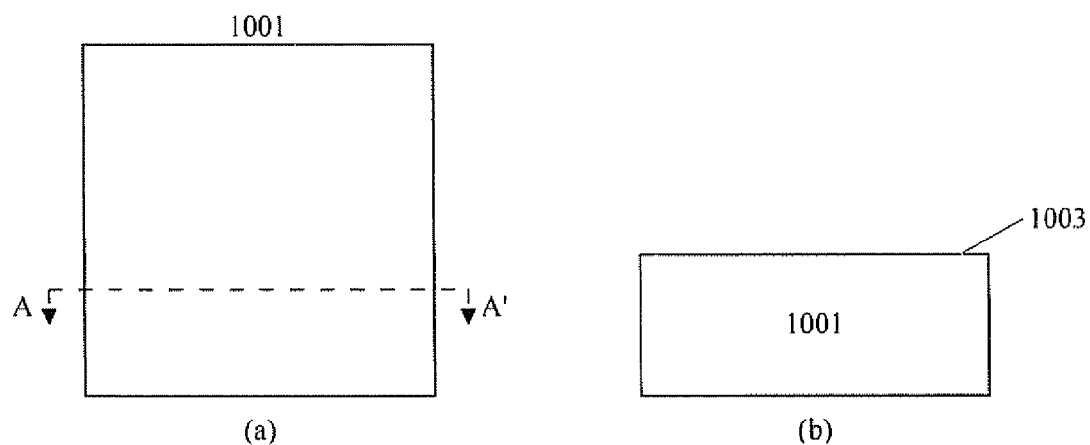

Finally, as shown in FIG. 5, the metal layer 1002 and the portion 1001' including the compound of Si, Cu, Ni and Fe and having the metal elements absorbed therein are removed. Preferably, a portion of the wafer 1001 close to the surface is removed along the balance line 1003. The removal may be performed by means of dry etching, Chemical Mechanical Polishing (CMP) or the like.

Thus, the wafer 1001 shown in FIG. 5 is completed. Most of the impurities in the wafer 1001 are absorbed due to the retrograde melting as described above, and thus the wafer is purified.

Second Embodiment

FIGS. 6-11 are schematic diagrams showing structures obtained in various steps in a flow of manufacturing a wafer according to a second embodiment of the present invention, respectively, wherein in each of the diagrams, portion (a) is a top view, and portion (b) is a section view taken along line A-A' in portion (a).

Figure 6:
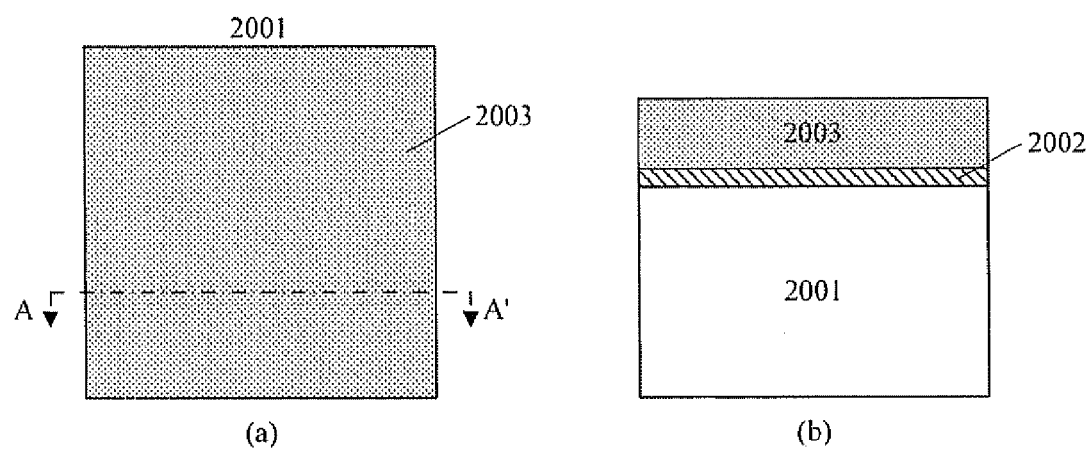
FIGS. 6-11 are schematic diagrams showing structures obtained in various steps in a processing flow of manufacturing a wafer according to a second embodiment of the present invention, respectively, wherein in each of the diagrams, Fig. (*a*) is a top down view, and Fig. (*b*) is a cross section view taken along line A-A' in Fig. (*a*)

As shown in FIG. 6, in the second embodiment, the processes in the method are performed on a wafer 2001. In FIG.

6, two hard mask layers 2002 and 2003 are also formed on the wafer 2001. For example, the first hard mask layer 2002 may comprise silicon oxide, and the second hard mask layer 2003 may comprise silicon nitride.

Figure 7:
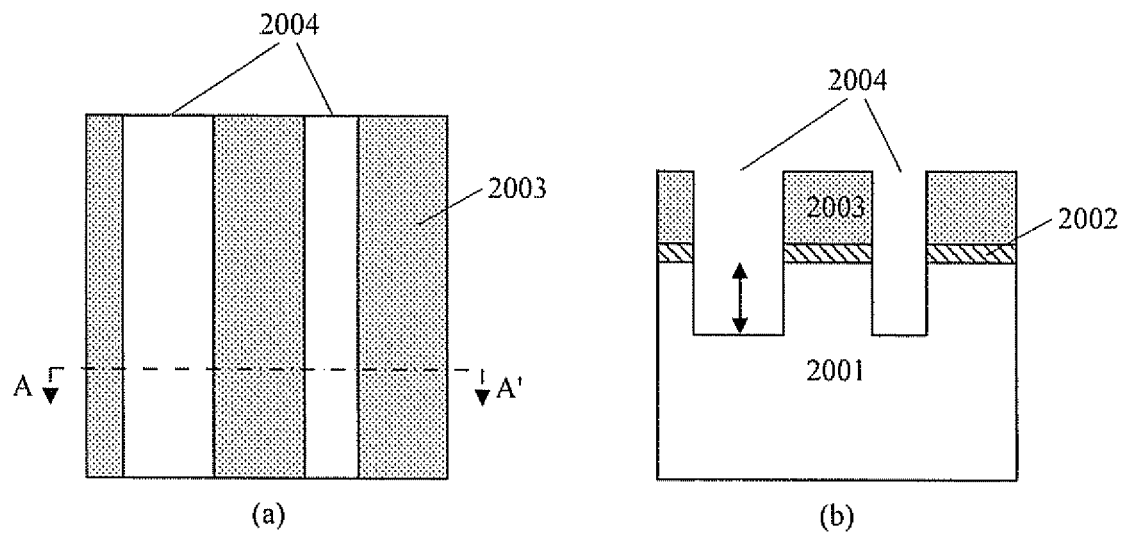

Next, as shown in FIG. 7, shallow trenches 2004 are formed by etching into the hard mask layers 2002 and 2003. The etching may be carried out by various means such as dry etching.

The depth of the trenches into the wafer 2001 (as shown by an arrow in FIG. 7(b)) to may vary between 10 nm and 1000 nm. Sidewalls of the trenches are vertical.

Figure 8:
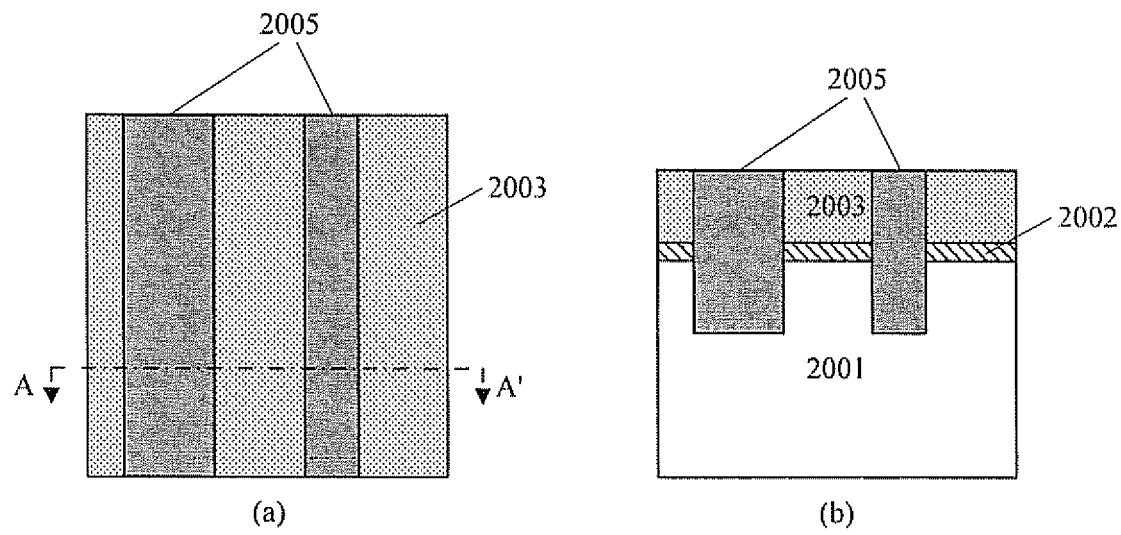

Then, as shown in FIG. 8, a metal layer 2005 is filled into the trenches 2004. The metal layer 2005 may comprise at least one of Cu, Ni and Fe elements. The filling of the trench may be performed by means of deposition, for example, CVD, PVD method.

Figure 9:
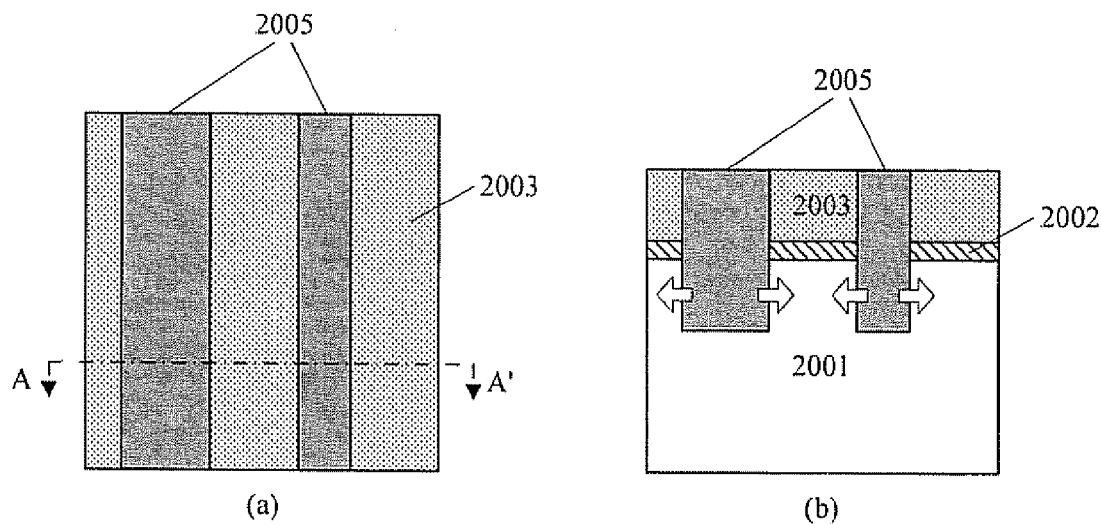

Next, the structure shown in FIG. 8 is heated to a sufficiently high temperature (above 1000° C., for example) so that the metal elements (Cu, Ni and Fe) of the metal layer 2005 may dissolve into the silicon of the wafer 2001. Here, the heating temperature should be lower than the melting point of the silicon (about 1414° C.) so that the silicon may not melt. This procedure is shown in FIG. 9, where arrows show the dissolving of the metal elements into the wafer 2001. Therefore, in a portion of the wafer surrounding the trenches 2004, a compound of Si, Cu, Ni and Fe is formed.

Here, preferably, the dissolving of the metal material into the wafer 2001 becomes oversaturated due to the big amount of the metals in the metal layer 2005. That is, the amount of the metal material dissolved into the silicon is more than that under stable conditions.

Figure 10:
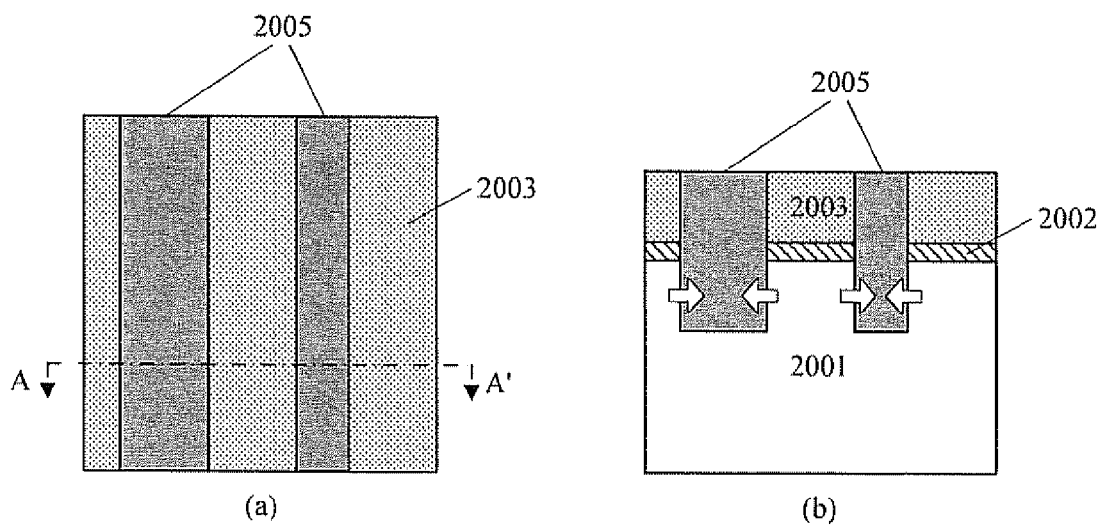

Subsequently, as shown in FIG. 10, the whole structure is cooled down gradually, for example, below 900° C., so that retrograde melting occurs. Specifically, when the structure is cooled down below 900° C., the portion of the wafer 2001 including the compound of Si, Cu, Ni and Fe may transform from a solid state to a slurry-like mix of solid and liquid. As shown by arrows in FIG. 10(b), impurities in the wafer are absorbed into the liquid portion, and thus the wafer is purified.

Figure 11:
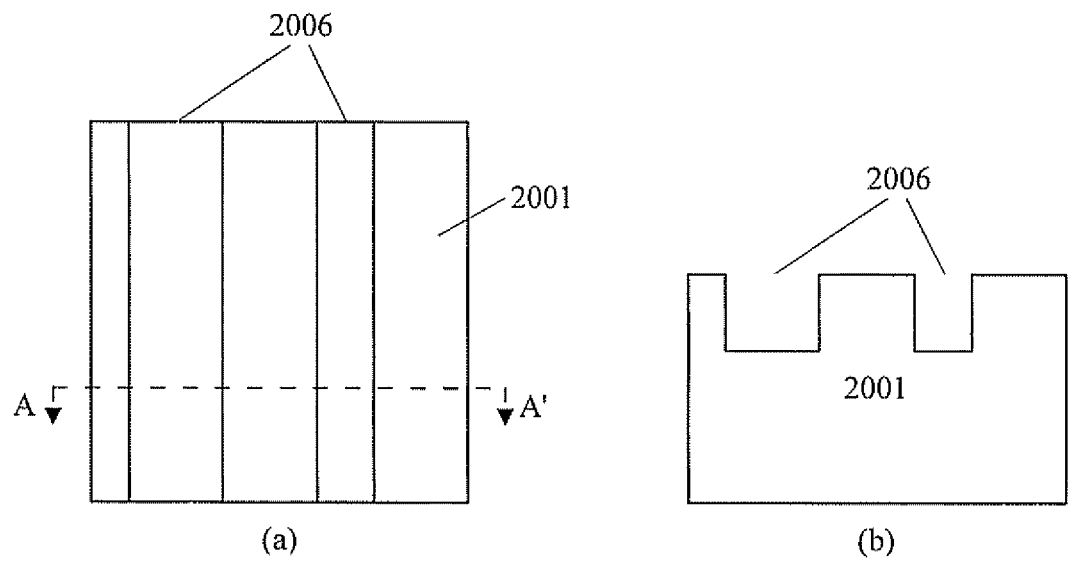

Finally, as shown in FIG. 11, the hard mask layers 2002 and 2003, and the metal layer 2005 are removed. The removal may be performed by means of dry etching, CMP or the like.

Preferably, a portion of the wafer 1001 close to the surface is removed along a balance line. For example, the portion of the wafer above the balance line may be subjected to oxidation, for example, thermal oxidation, to form an oxide, which may be removed by means of etching or the like.

Thus, the wafer 2001 shown in FIG. 11 is completed. Most of the impurities in the wafer 2001 are absorbed due to the retrograde melting as described above, and thus the wafer is purified.

Further, the process according to this embodiment is compatible with the STI process. Specifically, trenches 2006 may be formed in the wafer 2001. For example, it is possible to form STIs by filling insulator materials (for example, silicon oxide) into the trenches 2006.

Third Embodiment

FIGS. 12-16 are schematic diagrams showing structures obtained in various steps in a flow of manufacturing a wafer according to a third embodiment of the present invention, respectively, wherein in each of the diagrams, portion (a) is a top down view, and portion (b) is a cross section view taken along line A-A' in portion (a).

Figure 12:
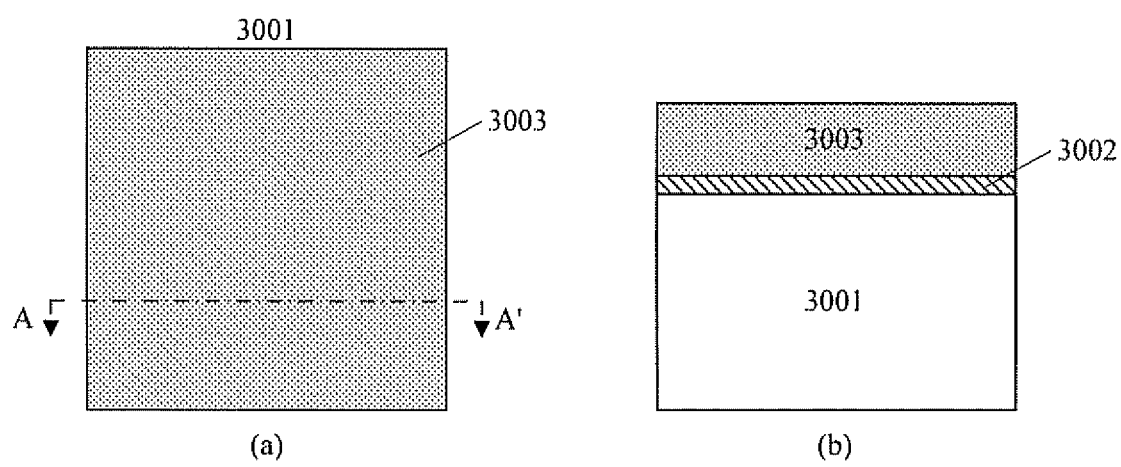
FIGS. 12-16 are schematic diagrams showing structures obtained in various steps in a processing flow of manufacturing a wafer according to a third embodiment of the present invention, respectively, wherein in each of the diagrams, Fig. (*a*) is a top down view, and Fig. (*b*) is a cross section view taken along line A-A' in Fig. (*a*)

As shown in FIG. 12, in the third embodiment, the processes in the method are performed to the wafer 3001, like the second embodiment Likewise, two hard mask layers 3002 and 3003 are also formed on the wafer 3001. For example, the first hard mask layer 3002 may comprise silicon oxide, and the second hard mask layer 3003 may comprise silicon nitride.

Figure 13:
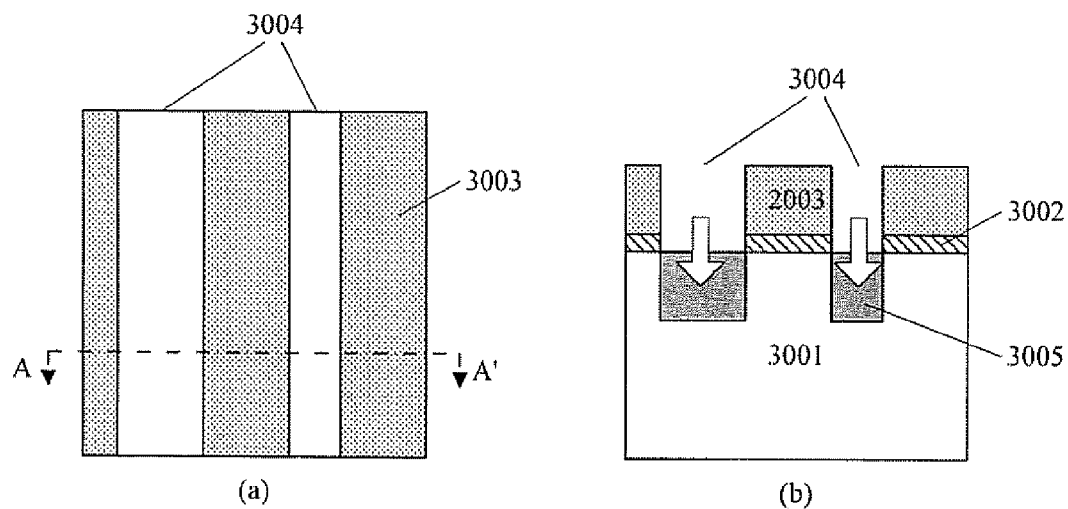

Next, as shown in FIG. 13, openings 3004 are formed in the first and second hard mask layers 3002 and 3003. For example, the openings 3004 may be formed corresponding to locations where STIs are designed to form. Here, unlike the second embodiment, the openings 3004 may not cut into the wafer 3001. In this embodiment, the metal materials such as Cu, Ni and Fe may be introduced into the wafer 3001 by means of ion implantation, as shown by arrows in FIG. 13(b), so that a portion 3005 containing Cu, Ni and Fe is formed in the wafer 3001. The depth of the metal implantation may be adjusted by controlling the implantation energy and dose.

Figure 14:
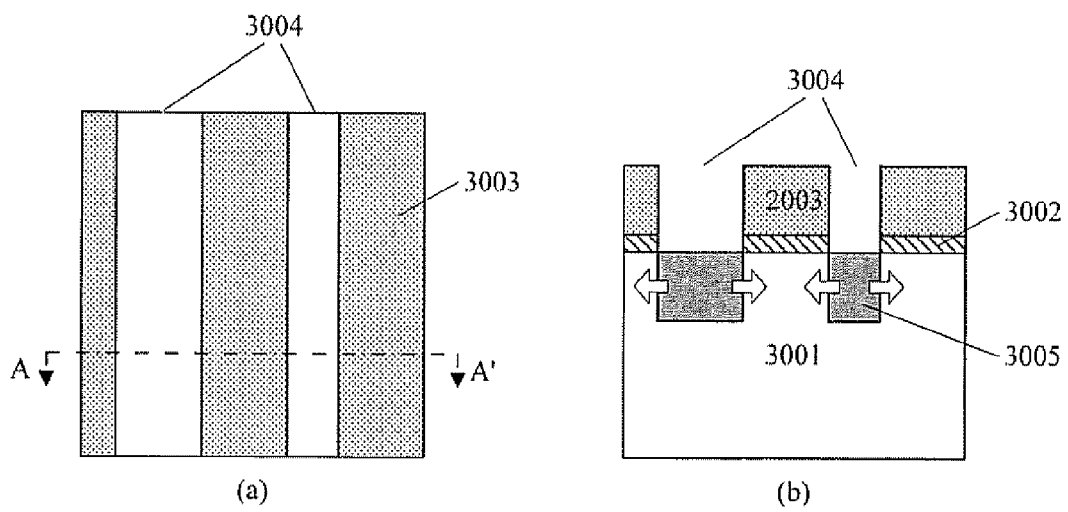

Then, the structure shown in FIG. 13 is heated to a sufficiently high temperature (above 1000° C., for example) so that the metal elements (Cu, Ni and Fe) of the portion 3005 may dissolve into the silicon. Here, the heating temperature should be lower than the melting point of the silicon (about 1414° C.) such that the silicon may not melt. This procedure is shown in FIG. 14, where arrows show the dissolving of the metal elements into the silicon. Therefore, in a portion of the wafer 3001 surrounding the portion 3005, a compound of Si, Cu, Ni and Fe is formed.

Here, preferably, the dissolving of the metal material into the wafer 3001 becomes oversaturated due to the big amount of the metals. That is, the amount of the metal materials dissolved into the silicon is more than that under stable conditions.

Figure 15:
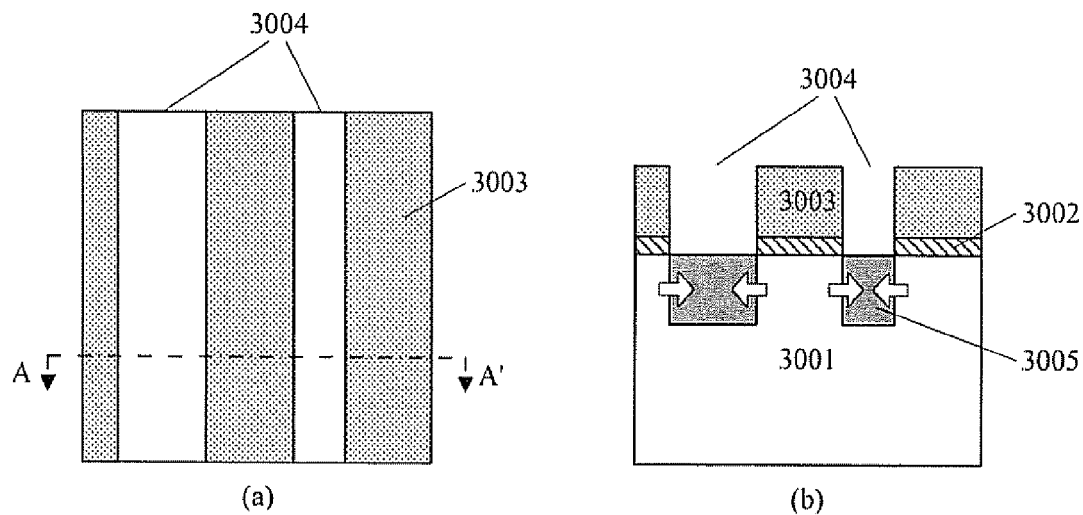

Subsequently, as shown in FIG. 15, the whole structure is cooled down gradually, for example, below 900° C., so that retrograde melting occurs. Specifically, when the structure is cooled down below 900° C., the portion of the wafer 3001 including the compound of Si, Cu, Ni and Fe may transit from a solid state to a slurry-like mix of solid and liquid. As shown by arrows in FIG. 15(b), impurities in the wafer are absorbed into the liquid portion, and thus the wafer is purified.

Figure 16:
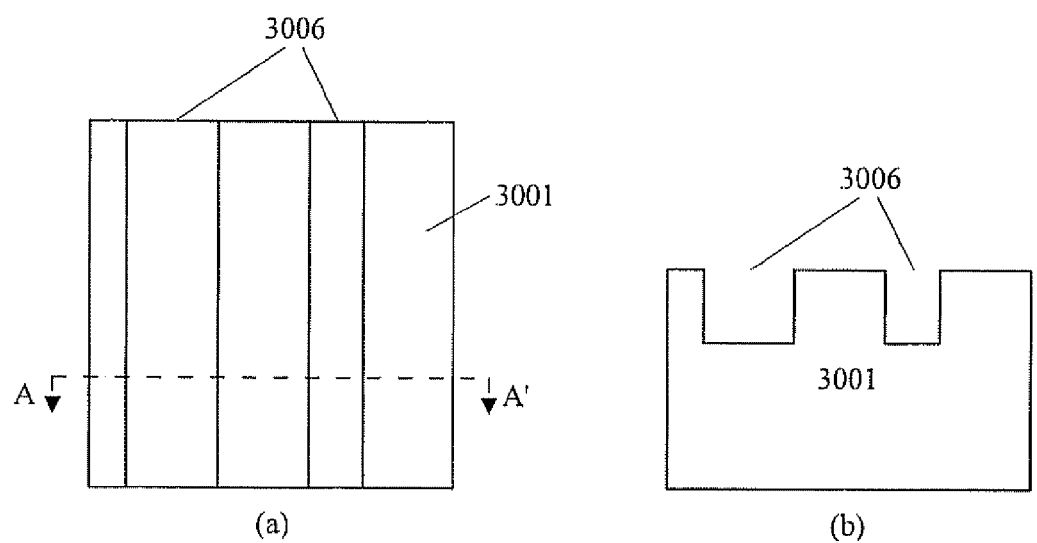

Finally, as shown in FIG. 16, the hard mask layers 3002 and 3003, and the portion 3005 affected by ion implantation are removed. The removal may be performed by means of dry etching, CMP or the like.

Preferably, a portion of the wafer close to the surface is removed along a balance line. For example, the portion of the wafer above the balance line may be subjected to oxidation, for example, thermal oxidation, to farm an oxide, which may be removed by means of etching or the like.

Thus, the wafer 3001 shown in FIG. 16 is completed. Most of the impurities in the wafer 3001 are absorbed due to the retrograde melting as described above, and thus the wafer is purified. Further, trenches 3006 are formed in the wafer 3001. For example, STIs may be formed by filling insulator materials (for example, silicon oxide) into the trenches 3006.

Fourth Embodiment

FIGS. 17-21 are schematic diagrams showing structures obtained in various steps in a flow of manufacturing a wafer according to a fourth embodiment of the present invention, respectively, wherein in each of the diagrams, portion (a) is a top down view, and portion (b) is a cross section view taken along line A-A' in portion (a).

Figure 17:
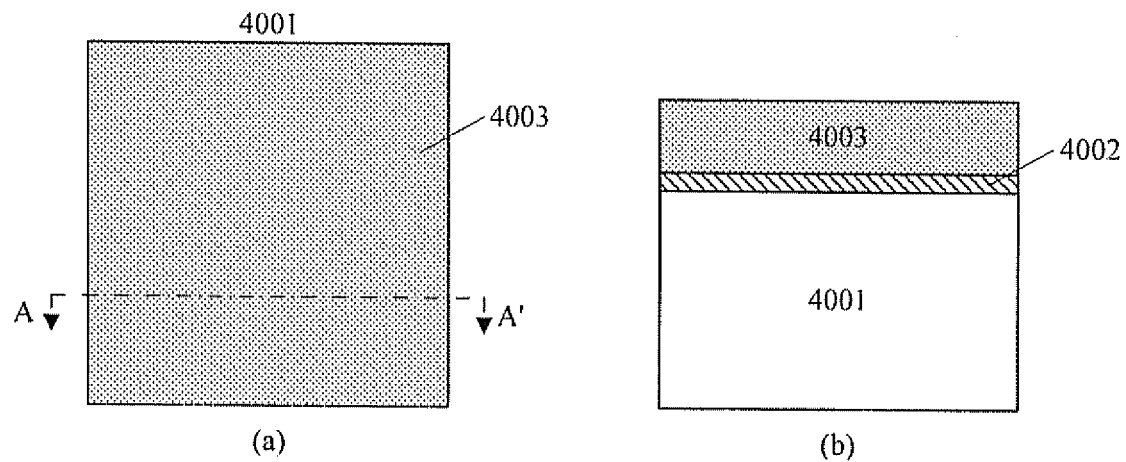
FIGS. 17-21 are schematic diagrams showing structures obtained in various steps in a processing flow of manufacturing a wafer according to a fourth embodiment of the present invention respectively, wherein in each of the diagrams, Fig.

As shown in FIG. 17, in the fourth embodiment, the processes in the method are performed in a wafer 4001, like the third embodiment. Likewise, two hard mask layers 4002 and 4003 are also formed on the wafer 4001. For example, the first hard mask layer 4002 may comprise silicon oxide, and the second hard mask layer 4003 may comprise silicon nitride.

Figure 18:
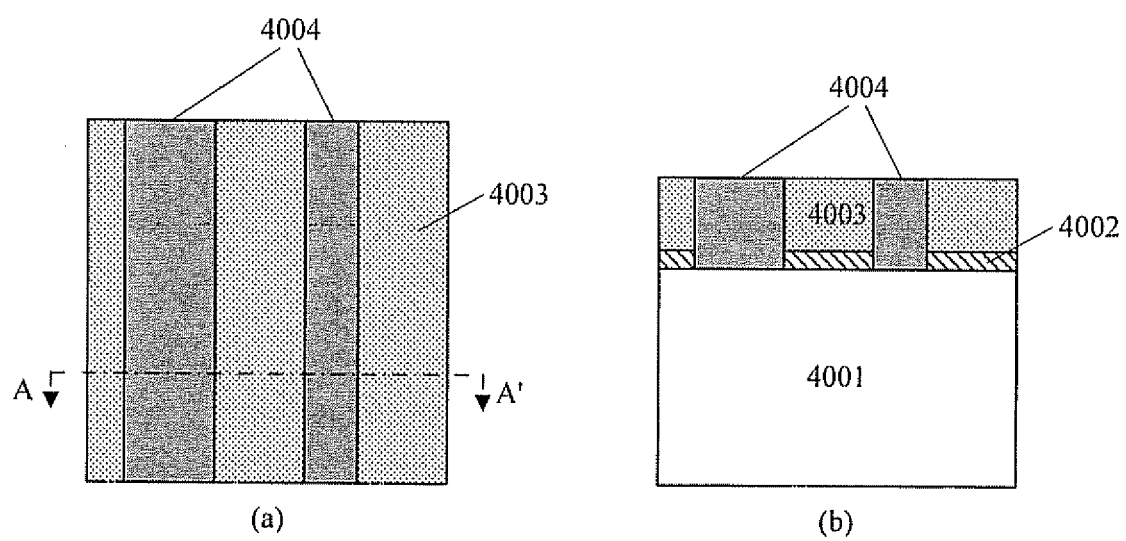

Next, as shown in FIG. 18, openings are formed in the first and second hard mask layers 4002 and 4003. For example, the openings may be formed corresponding to locations where STIs are designed to form. Here, unlike the second embodiment, the openings may not cut into the wafer 4001. In this embodiment, the openings are filled with a metal layer 4002 including at least one of Cu, Ni and Fe elements. The filling may be performed by means of deposition.

Figure 19:
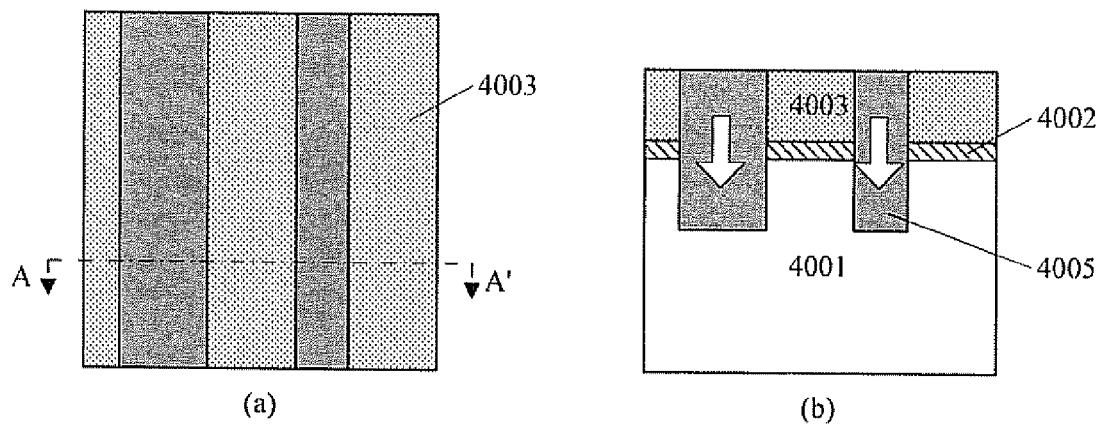

Then, the structure shown in FIG. 18 is heated to a sufficiently high temperature (above 1000° C., for example) so that the metal elements (Cu, Ni and Fe) of the metal layer 4004 may dissolve into the silicon of the wafer 4001. Here, the heating temperature should be lower than the melting point of the silicon (about 1414° C.) so that the silicon may not melt. This procedure is shown in FIG. 19, where arrows show the dissolving of the metal elements into the wafer. Therefore, in a portion of the wafer 4005 adjacent to the metal layer 4004, a compound of Si, Cu, Ni and Fe is formed.

Here, preferably, the dissolving of the metal material into the wafer 4001 becomes oversaturated due to the big amount of the metals. That is, the amount of the metal material dissolved into the silicon is more than that under stable conditions.

Figure 20:
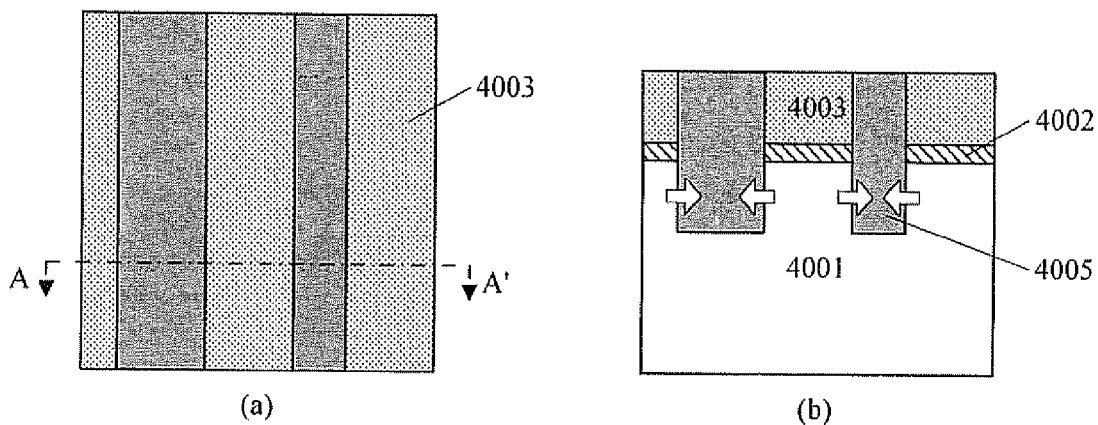

Subsequently, as shown in FIG. 20, the whole structure is cooled down gradually, for example, below 900° C., so that retrograde melting occurs. Specifically, when the structure is cooled down below 900° C., the portion 4005 of the wafer 4001 including the compound of Si, Cu, Ni and Fe may transform from a solid state to a slurry-like mix of solid and liquid. As shown by arrows in FIG. 20(*b*), impurities in the wafer are absorbed into the liquid portion, and thus the wafer is purified.

Figure 21:
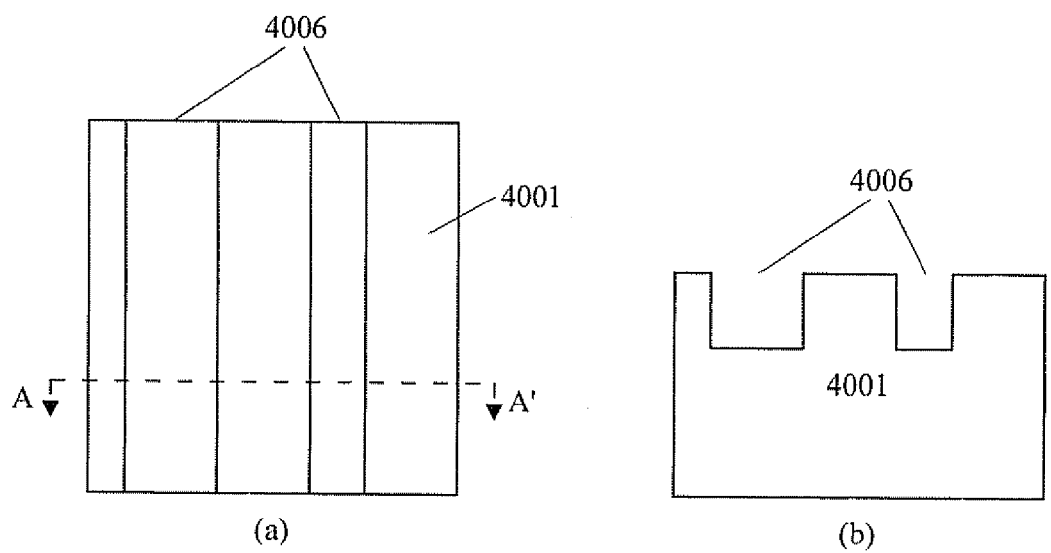

Finally, as shown in FIG. 21, the hard mask layers 4002 and 4003, and the portion 4005 of the wafer having the impurities absorbed therein are removed. The removal may be performed by means of dry etching, CMP or the like.

Preferably, a portion of the wafer close to the surface is removed along a balance line. For example, the portion of the wafer above the balance line may be subjected to oxidation, for example, thermal oxidation, to form an oxide, which may be removed by means of etching or the like.

Thus, the wafer 4001 shown in FIG. 21 is completed. Most of the impurities in the wafer 4001 are absorbed due to the retrograde melting as described above, and thus the wafer is purified. Further, trenches 4006 may be formed in the wafer 4001. For example, STIs may be formed by filling insulator materials (for example, silicon oxide) into the trenches 4006.

According to the embodiments of the present invention, the metal materials such as Cu, Ni and Fe elements may dissolve into Si of the wafer by heating (above 1000° C., for example), so that a compound of Si and at least one of Cu, Ni and Fe elements is formed. Then, retrograde melting may occur to the formed compound when structure is gradually cooled down (below 900° C., for example) to form a slurry-like mix of solid and liquid, which absorbs the impurities from the wafer. As a result, the wafer is purified.

In the above description, details of patterning and etching of the respective layers are not provided. It is to be understood by those skilled in the art that various means in the prior art may be utilized to form the layers and regions in desired shapes. Further, to achieve the same structure, those skilled can devise different methods from those described above. Although the respective embodiments are described above respectively, it does not necessarily mean that advantageous features of those embodiments cannot be used in combination.

The present invention is described above with reference to the embodiments thereof. However, those embodiments are provided just for illustrative purpose, rather than limiting the present invention. The scope of the invention is defined by the attached claims as well as equivalents thereof. Those skilled in the art can make various alternations and modifications without departing from the scope of the invention, which all fall within the scope of the invention.

What is claimed is:

1. A method for manufacturing a semiconductor wafer including a semiconductor material, comprising:
   providing metal elements in a given region on and/or in the semiconductor wafer;
   performing heating so that the metal elements dissolve into a compound region of the wafer near the given region to form a semiconductor-metal compound;
   performing cooling so that the formed semiconductor-metal compound is subjected to a retrograde melting to form a mixture of the metal elements and the semiconductor material in the compound region and a substantial portion of impurities in the wafer are absorbed into the compound region during the retrograde melting; and
   removing the metal elements in the given region and in the compound region containing the mixture.

2. The method according to claim 1, wherein the semiconductor material comprises silicon, and the metal elements comprise copper, nickel and iron elements.

3. The method according to claim 1, wherein the metal elements are provided by a metal layer formed on the wafer.

4. The method according to claim 1, wherein the metal elements are provided by a metal layer filled into a trench which is formed in the wafer.

5. The method according to claim 1, wherein the metal elements are provided to the wafer by ion implantation.

6. The method according to claim 1, wherein the metal elements are provided by a metal layer filled into a trench which is formed in a hard mask formed on the wafer.

7. The method according to claim 4, wherein the location of the trench corresponds to that of a Shallow Trench Isolation to be formed in the wafer.

8. The method according to claim 5, wherein the location of the implantation corresponds to that of a Shallow Trench Isolation to be formed in the wafer.

9. The method according to claim 1, further comprising:
   removing a portion of the wafer from a balance line to a surface of the wafer,
      wherein the concentration of the metal elements above the balance line is greater than that in the wafer body.

10. The method according to claim 1, wherein the metal elements dissolve into the semiconductor material of the wafer to be oversaturated.

11. The method according to claim 2, wherein the heating is performed to a temperature above 1000°C. and lower than the melting point of silicon.

12. The method according to claim 2, wherein the cooling is performed to a temperature below 900°C.

13. The method according to claim 1, wherein the wafer comprises one of a Silicon on Insulator wafer, a bulk silicon wafer, a GaN wafer and a GaAs wafer.

14. The method according to claim 6, wherein the location of the trench corresponds to that of a Shallow Trench Isolation to be formed in the wafer.

\* \* \* \* \*